United States Patent
Lee

(10) Patent No.: US 11,881,515 B2
(45) Date of Patent: Jan. 23, 2024

(54) VERTICAL THIN FILM TRANSISTOR WITH SINGLE GATE ELECTRODE WITH MICRO-PERFORATIONS

(71) Applicant: Solsona Enterprise, LLC, San Diego, CA (US)

(72) Inventor: Chong Uk Lee, Carlsbad, CA (US)

(73) Assignee: Solsona Enterprise, LLC, San Diego, CA (US)

(*) Notice: Subject to any disclaimer, the term of this patent is extended or adjusted under 35 U.S.C. 154(b) by 227 days.

(21) Appl. No.: 17/302,769

(22) Filed: May 12, 2021

(65) Prior Publication Data

US 2021/0265472 A1 Aug. 26, 2021

Related U.S. Application Data

(62) Division of application No. 16/397,341, filed on Apr. 29, 2019, now Pat. No. 11,049,948.

(Continued)

(51) Int. Cl.
| | | |
|---|---|---|
| *H01L 29/423* | (2006.01) | |
| *H01L 29/786* | (2006.01) | |
| *H01L 29/417* | (2006.01) | |

(52) U.S. Cl.
CPC .... *H01L 29/4238* (2013.01); *H01L 29/41733* (2013.01); *H01L 29/41741* (2013.01);
(Continued)

(58) Field of Classification Search
CPC ......... H01L 29/41733; H01L 29/41741; H01L 29/41775; H01L 29/42356;
(Continued)

(56) References Cited

U.S. PATENT DOCUMENTS

| | | | |
|---|---|---|---|
| 4,470,059 A | * 9/1984 | Nishizawa | H01L 29/20 257/E29.089 |
| 2006/0208251 A1 | * 9/2006 | Yoshizawa | H10K 10/00 257/40 |

(Continued)

OTHER PUBLICATIONS

Li, et al.; "High Speed Circuit with Bulk Accumulation Mode a-IGZO TFTs", 2014 21st International Workshop on Active Matrix Flatpanel Displays and Devices (AM-FPD); Jul. 2014; pp. 137-139.

(Continued)

*Primary Examiner* — Marcos D. Pizarro
(74) *Attorney, Agent, or Firm* — Lipsitz & McAllister, LLC

(57) ABSTRACT

The present invention provides a vertical-type thin film transistor (TFT). The vertical TFT may comprise a source electrode and a drain electrode extending parallel to each other, with a semiconductor layer arranged in between the source electrode and the drain electrode. A single gate electrode may be embedded in the semiconductor layer, the single gate electrode comprising micro-perforations configured to control the flow of electrons therethrough in dependence on a predetermined voltage difference between the source electrode and the single gate electrode. The gate electrode masks a direct electric field between the source electrode and the drain electrode. A rate of flow of electrons through the perforations is increased with an increase in the predetermined voltage.

9 Claims, 9 Drawing Sheets

Related U.S. Application Data

(60) Provisional application No. 62/691,795, filed on Jun. 29, 2018.

(52) U.S. Cl.
CPC .. *H01L 29/41775* (2013.01); *H01L 29/42356* (2013.01); *H01L 29/42376* (2013.01); *H01L 29/42384* (2013.01); *H01L 29/78642* (2013.01); *H01L 29/78645* (2013.01); *H01L 29/78648* (2013.01); *H01L 29/78696* (2013.01); *H01L 2029/42388* (2013.01)

(58) Field of Classification Search
CPC ........... H01L 29/42376; H01L 29/4238; H01L 29/42384; H01L 29/42388; H01L 29/78642; H01L 29/78696
See application file for complete search history.

(56) References Cited

U.S. PATENT DOCUMENTS

| | | |
|---|---|---|
| 2019/0393222 A1 | 12/2019 | Sharma et al. |
| 2020/0044095 A1 | 2/2020 | Wang et al. |
| 2020/0098930 A1 | 3/2020 | Le et al. |

OTHER PUBLICATIONS

Baek, et al.; "Electrical Properties and Stability of Dual-Gate Coplanar Homojunction DC Sputtered Amorphous Indium-Gallium-Zinc Oxide Thin-Film Transistors and Its Application to AM-OLEDs"; IEEE Transactions on Electron Devices, vol. 58, No. 12; Dec. 2011; pp. 4344-4353.

Dollinger, et al.; Vertical Organic Thin-Film Transistors with Anodized Permeable Base for Very Low Leakage Current; Advanced Materials, Mar. 2019, pp. 1-17.

* cited by examiner

VERTICAL THIN FILM TRANSISTOR WITH SINGLE GATE ELECTRODE WITH MICRO-PERFORATIONS

This application is a divisional of commonly-owned co-pending U.S. application Ser. No. 16/397,341 filed on Apr. 29, 2019, which claims the benefit of U.S. provisional patent application No. 62/691,795 filed on Jun. 29, 2018, each of which is incorporated herein and made a part hereof by reference.

BACKGROUND OF THE INVENTION

The present invention relates to the field of thin film transistors (TFTs). More specifically, the present invention relates to a vertical-structure TFT having a gate electrode structure adapted to allow the flow of electrons therethrough. Corresponding methods of producing such a vertical-type TFT are also provided.

Conventional TFTs have a planar Source-Drain structure. The Source and the Drain contact/electrode are horizontally arranged, with an active semiconducting material in between the Source and Drain. The Gate metal-oxide-semiconductor (MOS) structure is vertically arranged. The Gate electrode that controls the flow of electrons or holes between the horizontally placed Source and Drain contacts thru the semiconductor material. Such a structure is easy to build using a thin film deposition and etching/lift-off process. The carriers (electrons or holes) move between the Source and the Drain in a thin layer, forming a 2-D sheet channel layer that is typically less than tens of nanometers thick.

For example, wide bandgap metal oxide semiconductor (typically bandgap >3.0 eV) based TFTs are promising for low-cost, flexible, wearable and disposal device applications because of their features such as low temperature processability and compatibility with a wide variety of low-cost deposition processes, including solution-based processes. However, the typical transistor mobility is only about 10 $cm^2/Vs$ in such a standard TFT device with a lateral active channel with a typical length of about 5-20 microns (i.e., effective channel length). Therefore, the controllable drain current is limited to the level of mA. Typical TFT dimensions are as follows: approximately 50 nm-thick Source and Drain electrodes; approximately 150 nm-thick Gate oxide; approximately 50 nm-thick channel layer; and approximately 50 nm-thick gate electrode. Therefore, a typical aspect ratio of the vertical/lateral dimensions is approximately 300 nm/10000 nm.

FIG. 1A shows a typical prior art oxide-TFT structure with a lateral active channel (typically, the channel length is about 5-20 microns, and the channel width is about 10-20 microns) having a bottom-gate structure, while FIG. 1B shows a typical prior art oxide-TFT structure with a lateral active channel having a top-gate structure. Current flows from drain to source laterally in both structures (electron moves from source to drain.)

Thin Film Transistors, especially those fabricated for flat panel display (FPD, i.e., LCD, OLED, etc.), typically have relatively large feature dimensions, in the order of a few micrometers or larger. The distance between the source and the drain is relatively large, sometimes several micrometers or more. The longer the channel length between the source and the drain is, the longer the distance the current carriers have to travel. Therefore, the resulting transistor switches slowly. In many cases, the channel length is limited by the fineness of the patterning process, either by photo lithography or printing, or other patterning methods. On the other hand, the thickness of the layers, as the thin film process implies, can be much smaller in dimension. That is, the thickness of the individual layers can be as thin as the deposition process can produce, limited by the uniformity of the film that is laid down. Often times, this thickness can be controlled to 100's of nanometers, sometimes 10's of nanometers and sometimes several nanometers. This opens up an opportunity to consider a vertical transistor structure, where the current carriers traverse vertically between layers, rather than horizontally.

It would be advantageous to leverage the ability to control the layer thickness to enable a vertical transistor structure and to enable the use of a vertically arranged gate electrode structure. Such a structure would advantageously provide transistor operations with low switching times and high drain current.

The apparatus and methods of the present invention provide the foregoing and other advantages.

SUMMARY OF THE INVENTION

The present invention relates to a vertical-structure type thin film transistor (TFT) having a gate electrode structure adapted to allow the flow of electrons therethrough, which provides a high current drain current and low operation voltage.

In one example embodiment of the present invention, a vertical TFT is provided. The vertical TFT may comprise a source electrode and a drain electrode extending parallel to each other, with a semiconductor layer arranged in between the source electrode and the drain electrode. Two or more gate electrodes may be embedded in the semiconductor layer, the two or more gate electrodes being arranged parallel to one another. Each of the two or more gate electrodes comprising a structure adapted to allow the flow of electrons therethrough.

For example, the structure of each of the gate electrodes may comprise a comb-like structure with combs of each of the gate electrodes being offset relative to combs of adjacent gate electrodes. Alternatively, at least one of the two or more gate electrodes may comprise a comb-like structure. The comb-like structure may block a direct electric field between the source electrode and the drain electrode. The comb-like structure may allow the flow of electrons around and between the combs.

The structure of each of the gate electrodes may comprise one of a comb-like structure, a mesh structure, a perforated structure, a lattice structure, and the like. The structure may block a direct electric field between the source electrode and the drain electrode. The structure may allow the flow of electrons around and between elements of the structure.

The source electrode may be arranged below the drain electrode in a vertical arrangement. A 3-dimensional volume of current carrying electrons may flow from the source electrode to the drain electrode between the structure of the gate electrodes.

A gap between a first gate electrode of the two or more gate electrodes and the source electrode may be of a different dimension than a gap between a second gate electrode of the two or more gate electrodes and the drain electrode.

The gate electrodes may be insulated from the semiconductor layer by an insulator. The insulator may comprise an oxide or a nitride.

The semiconductor layer may comprise one of silicon, a III-V semiconductor material, an organic semiconductor, a metal-oxide based semiconductor, a silicon-based material, an oxide-based material, or the like.

A first gate voltage of a first gate electrode of the two or more gate electrodes may be tied to a second gate voltage of a second gate electrode of the two or more gate electrodes such that the same voltage is applied to the first and second gate electrodes.

Alternatively, a first gate voltage of a first gate electrode of the two or more gate electrodes may be controlled independently of a second gate voltage of a second gate electrode of the two or more gate electrodes.

A vertical active channel of the semiconductor layer may have a length between approximately 10 nm-5 um and a channel width of between approximately 1 um-10 mm.

The semiconductor layer and the two or more gate electrodes may be formed by one of a physical vapor deposition process and a solution process. An insulator applied to the two or more gate electrodes may be formed by a post-thermal annealing process. The insulator may comprise an aluminum oxide gate insulator.

The post-thermal annealing process may be performed under several atmospheric conditions (e.g., vacuum, oxygen, ozone, etc.).

In a further example embodiment of a vertical TFT in accordance with the present invention, the vertical TFT may comprise a source electrode and a drain electrode extending parallel to each other, with a semiconductor layer arranged in between the source electrode and the drain electrode. A single gate electrode may be embedded in the semiconductor layer. The single gate electrode may comprise micro-perforations configured to control the flow of electrons therethrough in dependence on a predetermined voltage difference between the source electrode and the single gate electrode.

The gate electrode may be formed using one of a CMOS fabrication method, e-beam lithography, and laser lithography. The micro-perforations may be formed due to one of a property of a material of the gate electrode, a property of a material mixed with the material of the gate electrode, a deposition method, a curing method, an annealing method, or the like.

The micro-perforations may have a diameter or a width of approximately 1 nm-1 um and a thickness of approximately 10 nm-1 um.

The gate electrode may mask a direct electric field between the source electrode and the drain electrode. A rate of flow of electrons through the perforations may be increased with an increase in the predetermined voltage.

The gate electrode may be insulated from the semiconductor layer by an insulator. The insulator may comprise an oxide or a nitride.

The semiconductor layer may comprise one of silicon, a III-V semiconductor material, an organic semiconductor, a metal-oxide based semiconductor, a silicon-based material, and an oxide-based material. The semiconductor layer and the gate electrode may be formed by one of a physical vapor deposition process and a solution process.

An insulator may be formed on the gate electrode by a post-thermal annealing process. The insulator may comprise an aluminum oxide gate insulator.

The gate electrode may be formed using one of a CMOS fabrication processes, e-beam lithography, laser lithography, or the like. The micro-perforations may be formed due to one of a property of a material of the gate electrode, a property of a material mixed with the material of the gate electrode, a deposition method, a curing method, or an annealing method.

BRIEF DESCRIPTION OF THE DRAWINGS

The present invention will hereinafter be described in conjunction with the appended drawing figures, wherein like reference numerals denote like elements, and.

DETAILED DESCRIPTION

Figure 1A:
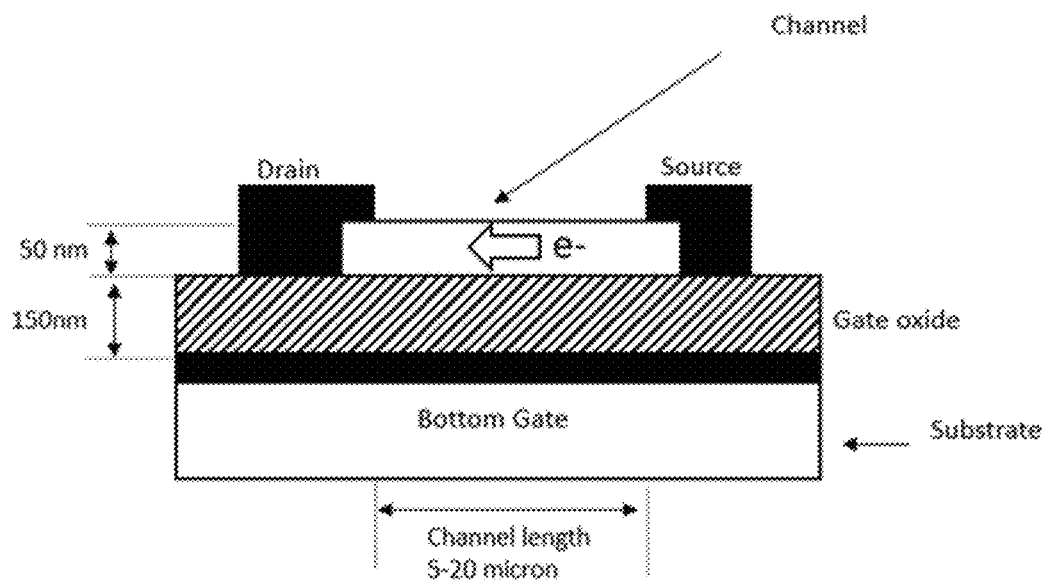
FIG. 1A shows an example embodiment of a prior art oxide-TFT structure with a lateral active channel having a bottom gate structure.
Figure 1B:
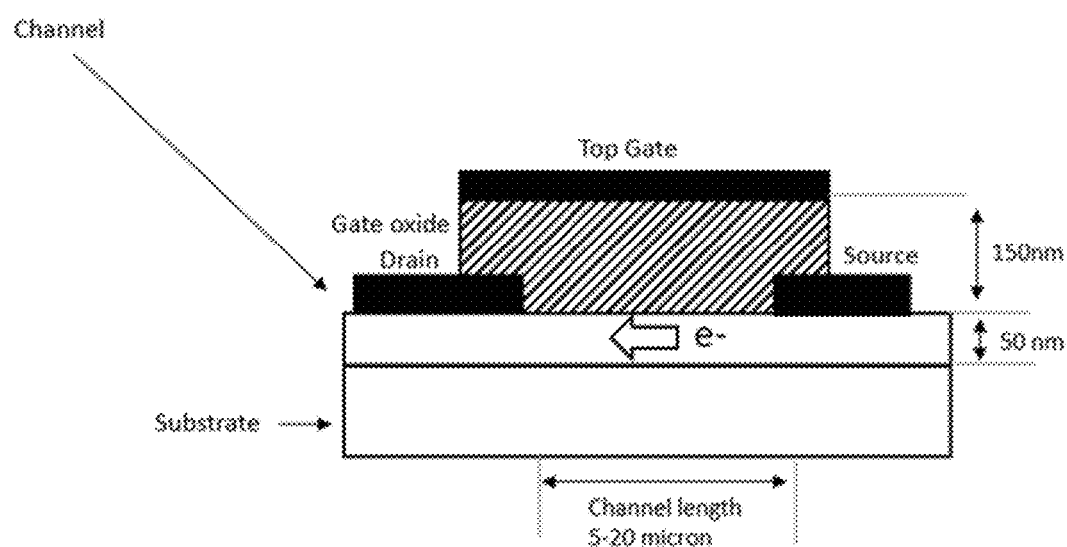
FIG. 1B shows an example embodiment of a prior art oxide-TFT structure with a lateral active channel having a top-gate structure.

The ensuing detailed description provides exemplary embodiments only, and is not intended to limit the scope, applicability, or configuration of the invention. Rather, the ensuing detailed description of the exemplary embodiments will provide those skilled in the art with an enabling description for implementing an embodiment of the invention. It should be understood that various changes may be made in the function and arrangement of elements without departing from the spirit and scope of the invention as set forth in the appended claims.

The present invention relates to a vertical-type thin film transistor (TFT) having a gate electrode structure adapted to allow the flow of electrons therethrough, which provides a high current drain current ($I_{DS}>0.1$ A) and low operation voltage ($V_{th}<1.5$V). Corresponding methods of producing such a vertical-type thin film transistor are also provided. For example, one embodiment may comprise a vertical-structure type TFT using a wide band gap oxide semiconductor channel including amorphous/crystalline materials and a gate electrode structure adapted to allow the flow of electrons therethrough (such as a perforated or comb-like structure), which provides a high current drain current ($I_{DS}>0.1$ A) and low operation voltage ($V_{th}<1.5$V).

Although the present invention is described herein in relation to an enhancement mode type transistor, those skilled in the art will appreciate that the vertical structure disclosed herein may be used in a depletion mode type transistor by changing device parameters such as the turn on threshold voltage. Further, the vertical structure of the present invention may be used to implement different types of transistor structures, including non-TFT structures.

The present invention involves controlling the current carriers between the source and the drain that are arranged vertically one above the other. Basically, the current will flow between 2-D sheets of source and drain contacts, where the semiconducting material is sandwiched between the vertically arranged source and the drain contacts. This results in a 3-D volume of current carrying electrons (or holes) flowing from the source electrode to the drain electrode between the structure of the gate electrodes, thereby increasing the total current that can be switched. Since the current flow is vertical and over a shorter distance, high current is achieved. Also, the switching on-resistance decreases and the transistor switching time is reduced, resulting in a fast, high current handling transistor.

It should be appreciated that the term "electrons" is synonymous with the term "current carriers" as used herein, which is typical of N-type semiconductors. Those skilled in the art should appreciate that if a P-type semiconductor is involved, the current would be carried by holes. In a popular TFT design, the semiconductor material can be Silicon, such as amorphous Si and poly-Si or an oxide semiconductor material, such as IGZO (Indium Gallium Zinc Oxide), which typically form N-type channels. In an organic TFT, the semiconducting material is more often a P-type material. An intrinsic semiconductor, such as undoped Silicon, has an approximately equal number of electrons and holes present as current carriers. It should be understood that the present invention applies equally well to all semiconducting materials, even though the present disclosure primarily discusses using electrons as the current carrier.

It should also be understood that the vertical transistor structure disclosed herein equally applies to other transistor designs that are not constructed using the TFT process, such as CMOS processes that start with bulk substrates.

Figure 2A:
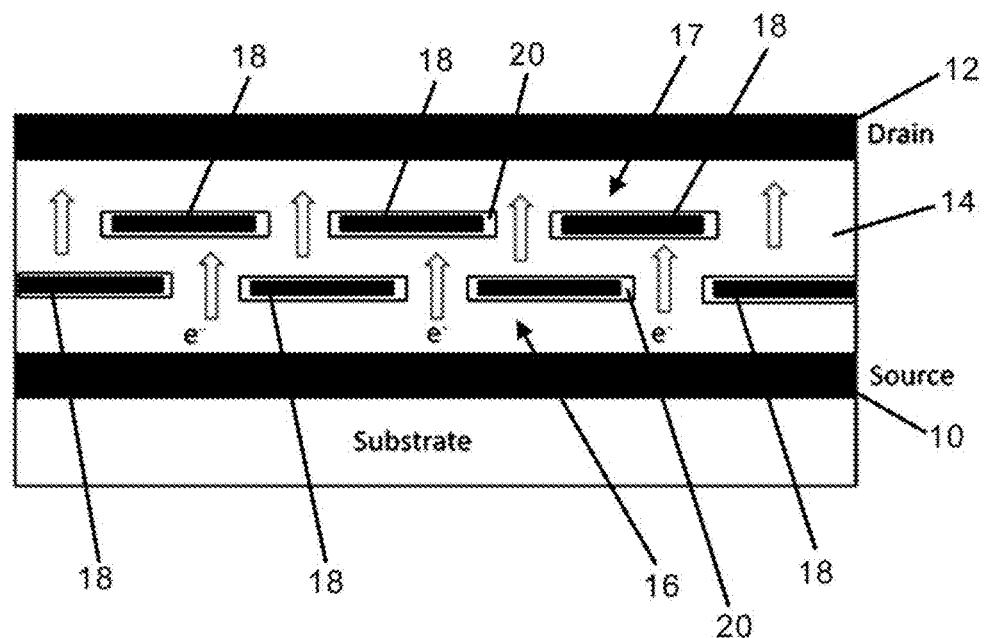
FIGS. 2A and 2B show an example embodiment of a vertical TFT structure in accordance with the present invention.
Figure 2B:
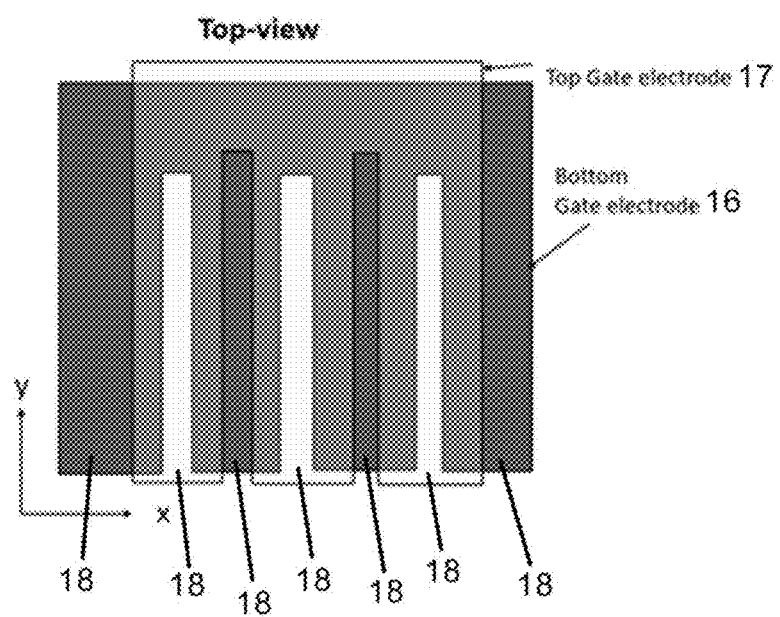

One aspect of the present invention is the use of embedded gate electrodes within the semiconductor material. An example embodiment of a vertical TFT structure in accordance with the present invention is shown in FIGS. 2A and 2B. A source electrode 10 and a drain electrode 12 extend parallel to one another, with the source electrode 10 below the drain electrode 12. A semiconductor layer 14 is arranged between the source electrode 10 and the drain electrode 12. Two or more layers of gate electrodes (e.g., first gate electrode 16 (also referred to herein as the bottom gate electrode) and second gate electrode 17 (also referred to herein as the top gate electrode)) are embedded in the semiconductor layer 14 between and parallel to the source electrode 10 and the drain electrode 12. Each of the two or more gate electrodes 16, 17 comprise a structure adapted to allow the flow of electrons therethrough.

Each gate electrode 16, 17 may be perforated, or have a mesh, gate, lattice, or comb-like structure to let electrons flow between the elements of the structure itself. The present invention encompasses any gate electrode structure that allows the flow of electrons between and/or around the elements of the structure. Accordingly, although various embodiments of the present invention are discussed below as employing a comb-like gate electrode structure (also referred to herein as "comb-gate electrodes"), the present invention encompasses any type of gate electrode structure that allows the flow of electrons through the structure itself, such as a mesh structure, a perforated structure, a lattice structure, an offset structure, or any similar structure that permits the flow of electrons therethrough, as will be described in more detail below.

Figure 3A:
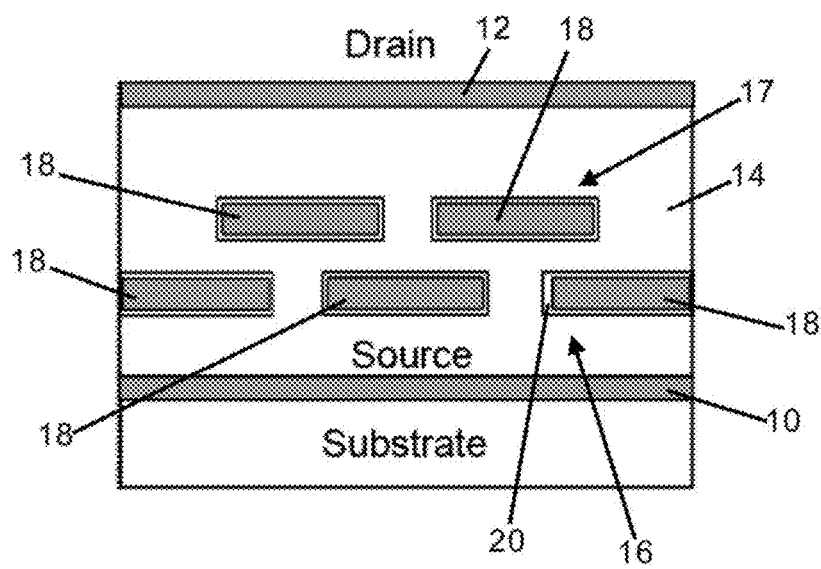
FIGS. 3A, 3B, and 3C show a further example embodiment of a vertical TFT structure in accordance with the present invention.
Figure 3B:
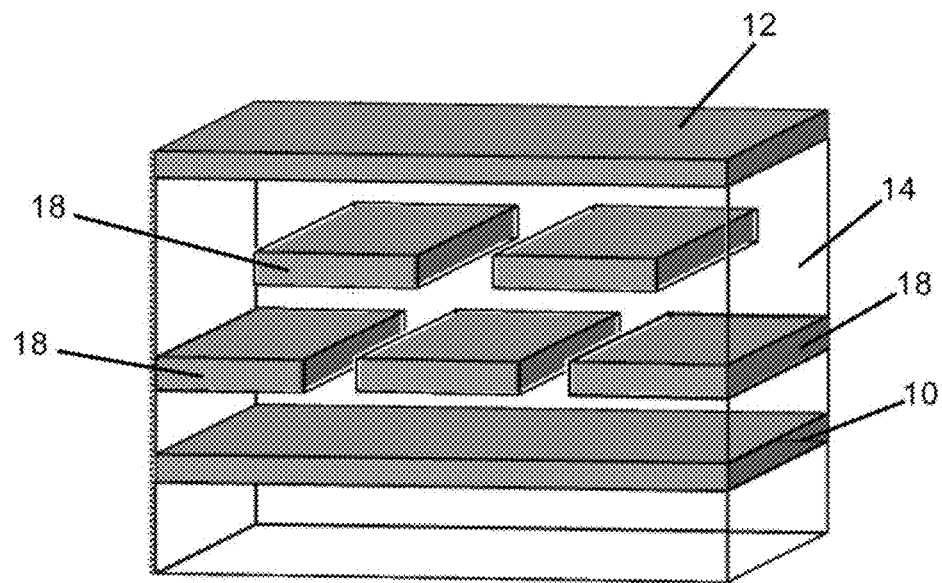
Figure 3C:
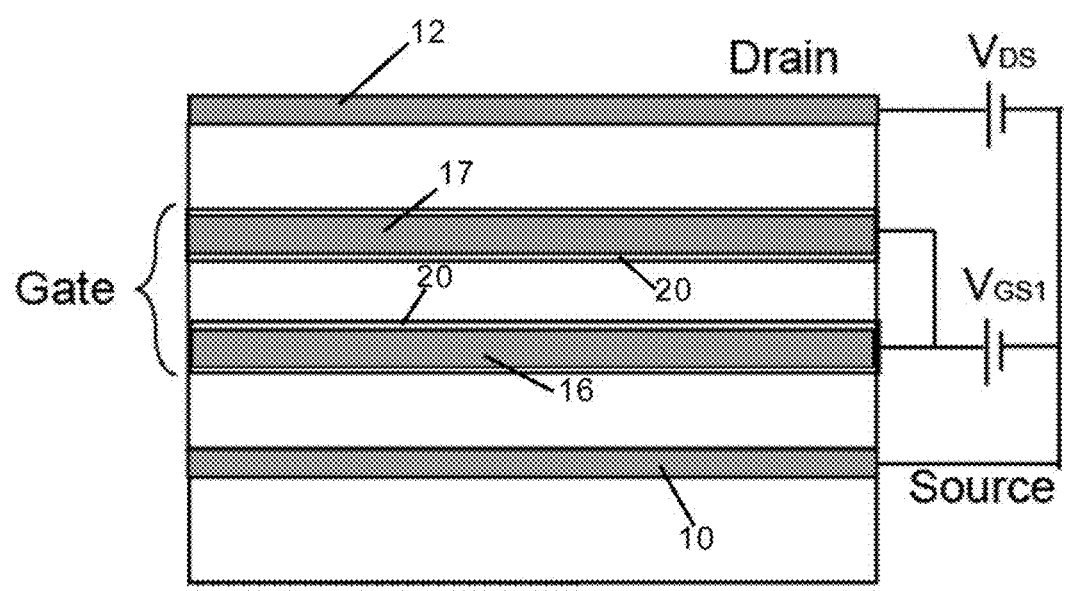

In an embodiment comprising a comb-like gate electrode structure as shown in FIGS. 2A and 2B, the combs 18 of adjacent gate electrodes 16, 17 are offset from one another such that, for example, the combs 18 of the one gate electrode are aligned with the spaces between the combs of an adjacent gate electrode and vice versa, as shown in FIG. 2B. This arrangement blocks a direct electric field between the source electrode 10 and the drain electrode 12 by preventing a direct path from the source to the drain for the electrons. This prevents the device from turning on inadvertently. When the gate voltage Vgs1 between the source electrode 10 and the first gate electrode 16 is below Vth, the turn on voltage, the transistor stays turned off regardless of the drain voltage. When the gate voltage Vgs1 exceeds the turn on voltage Vth, the carrier electrons are generated within the semiconductor layer 14 and the electrons flow between the combs 18, past the second gate electrode 17, and flow to the drain electrode 12, thereby turning on the transistor. The gate voltage Vgs2 of the second gate electrode 17 can be tied to the first gate electrode 16 for this purpose, applying the same voltage to each gate electrode 16, 17. FIGS. 3A-3C show a further example of a comb gate electrode configuration in a vertical TFT structure in accordance with the present invention where the same voltage is applied to both gate electrodes 16, 17.

Figure 4A:
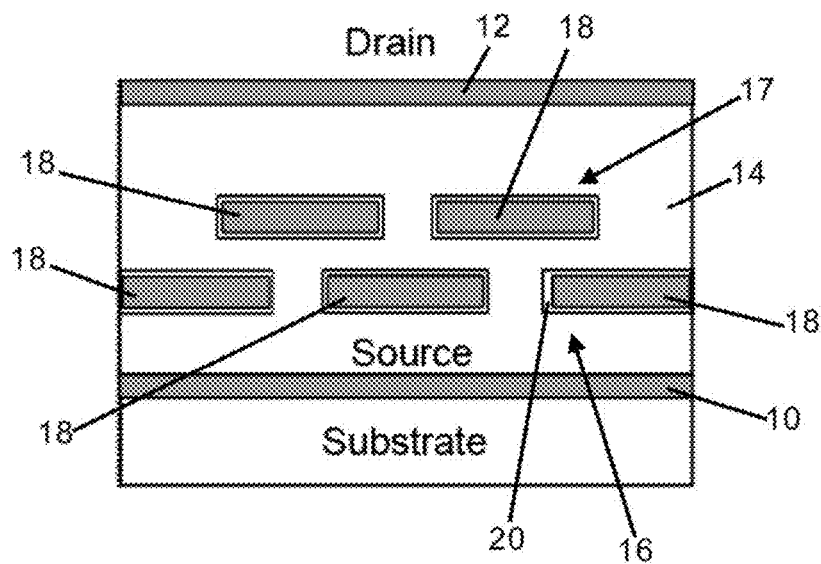
FIGS. 4A, 4B, and 4C show a further example embodiment of a vertical TFT structure in accordance with the present invention.
Figure 4B:
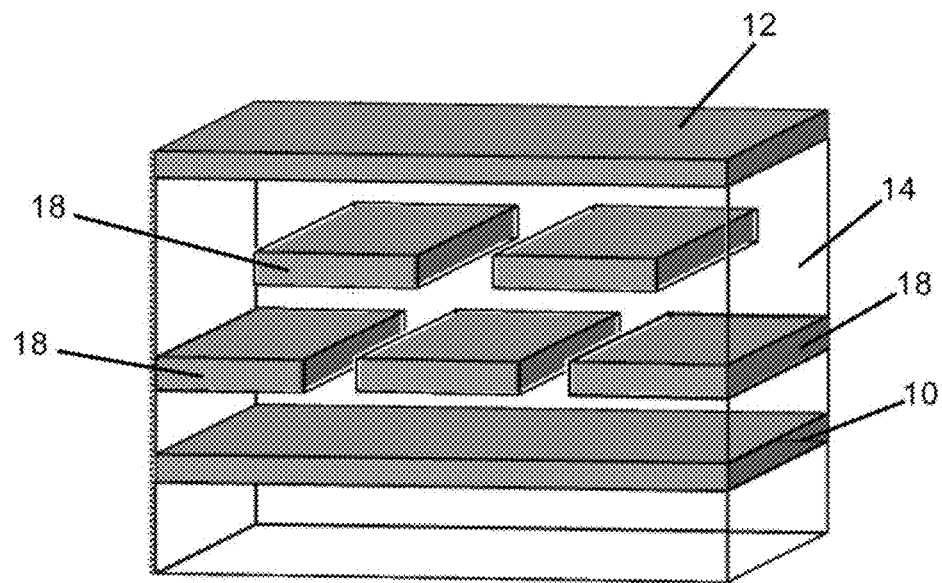
Figure 4C:
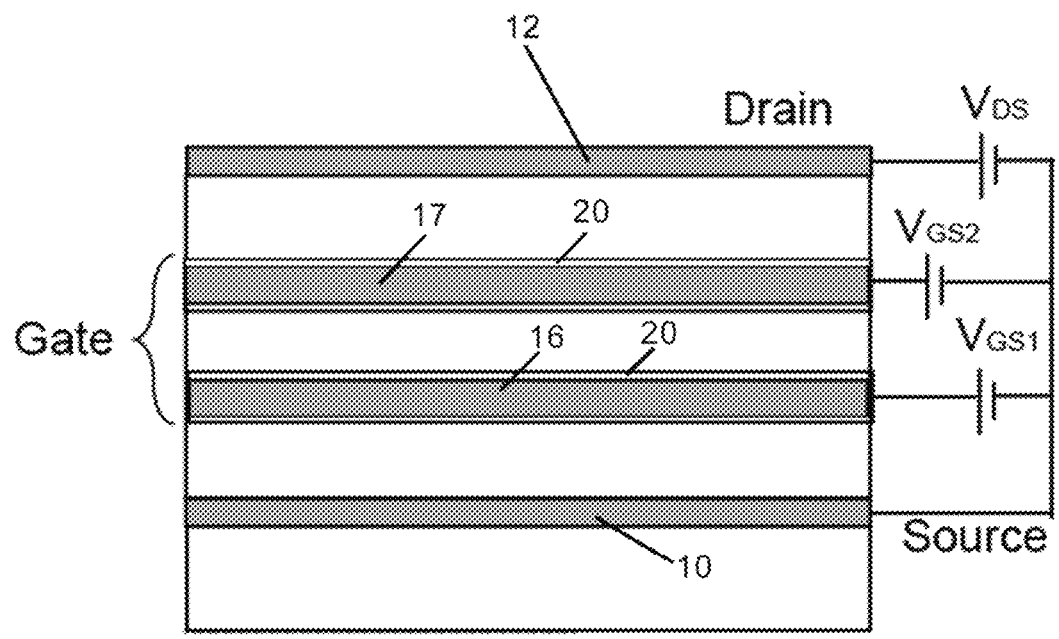

However, an independent control of the Vgs1 and Vgs2 may lead to other modes of operation for the same transistor device. For example, when an intrinsic semiconductor is used as the channel, a sufficient voltage difference between Vgs1 and Vgs2 would generate carrier electrons and holes in the semiconductor layer 14 around the two gate electrodes 16, 17, which would turn the transistor on. FIGS. 4A-4C shows an example of a comb gate electrode configuration in a vertical TFT structure in accordance with the present invention having a dual gate electrode structure where Vgs1 and Vgs2 are controlled independently. As shown in FIGS. 3C and 4C, the comb gate electrodes 16, 17 may be connected at the outside of semiconductor channel 14.

A gap between a first gate electrode 16 of the two or more gate electrodes and the source electrode 10 may be of a different dimension than a gap between a second gate electrode 17 of the two or more gate electrodes and the drain electrode 12. For example, it should be noted that the placement of the first gate electrode 16 closer to the source electrode 10 can sometimes be preferable, in order to reduce the turn on voltage Vth. The gap between the second gate electrode 17 and the drain electrode 12 can be increased to handle high drain voltage without breakdown. The combined effect would produce a high voltage handling transistor without having to increase the turn on voltage. Of course, the size or area of the source and the drain electrodes would increase the total current that can be switched. Therefore, various choices of the dimensions of this TFT would lead to different optimizations for various applications.

It should also be noted that both the first gate electrode 16 and the second gate electrode 17 (or more if present) should be sufficiently insulated from the semiconductor material by an insulator 20 so that no current flows in and out of the gate. The thickness of this insulator 20, which may be an oxide or a nitride, need not be very thick. For example, the thermal oxide that naturally forms around an aluminum gate electrode may be sufficient to insulate the gate electrode 16, 17 from the semiconductor material.

One example embodiment may employ a metal-oxide-semiconductor (MOS) structure. A wide bandgap metal oxide semiconductor channel may include crystal, polycrystal, micro-crystal, Nano-crystal, polymorphous, or amorphous forms. The semiconductor channel may also include a monoxide (such as ZnO, SnO, In2O3, Ga2O3, etc.) and multicomponent forms including binary systems (In—Zn—O (IZO), Sn—Zn—O (TZO), Ga—Zn—O (GZO), etc.), ternary systems (In—Ga—Zn—O (IGZO), In—Al—Zn—O (IAZO), Sn—Ga—Zn—O (TGZO) and more (In—Sn-Ga—ZnO (ITGZO) and In—Sn—Al—ZnO (ITAZO), etc.). Additionally, several combinations of Gate/gate oxides can be used such as $Si/SiO_2$, $Al/Al_2O_3$, $Ti/TiO_x$, Mo/MoOx and the like.

In accordance with such an example embodiment, the MOS structure may be provided with vertically stacked built-in gate electrodes. To achieve a high drain current, a short vertical channel (typically 10-200 nm) is preferable. Such a TFT operates with a gate bias of less than 3V and controls a high drain current in the order of amps, many orders of magnitude higher than a lateral transistor of a comparable size. However, the present invention may be implemented with a vertical active channel of the semiconductor layer having a length between 10 nm-5 um and a channel width of between 1 um-10 mm.

The comb gate/gate oxide configuration built into the active layer enables the control of current flow effectively and can achieve a low off current (<fA) and a large on/off current ratio.

The example embodiment of a vertical TFT shown in FIGS. 2A and 2B comprises two built-in gate electrodes 16, 17 in a comb gate/gate oxide configuration, one comb gate electrode being arranged above the other comb gate electrode. In such a configuration, electrons move from the bottom (source electrode 10) to the top (drain electrode 12). The active channel is vertical with a length of about 100-200 nm. The gate electrodes 16, 17 are arranged inside of the active channel region. The lateral dimension (i.e. channel width) depends on the number of comb gate electrode configurations, which is not limited. The range of a typical lateral dimension may be about 10-20 um.

However, the present invention may be implemented using only one layer of comb gate electrode, two comb gate electrodes as shown in FIGS. 2A-4C, or more layers of comb gate electrodes. Further, the present invention may be implemented with an offset gate structure, where one solid gate electrode is offset from an adjacent solid gate electrode, blocking a direct path for current flow from the source to the drain.

In a further example embodiment, a vertical channel TFT with a-In—Ga—Zn—O (a-IGZO) channels and Al/AlOx gate structure may be provided. The TFT structure can be fabricated on various materials including glass, plastics, ceramics, and the like. An amorphous In—Ga—Zn—O (a-IGZO) channel may be prepared by a physical vapor deposition (PVD) process such as sputtering or a solution process such as inkjet or a sol-gel process. Also, the aluminum gate electrode(s) may be prepared by a PVD method or a solution process. The aluminum oxide gate insulator may be formed by post-thermal annealing. The typical annealing temperature may be about 150-250° C. and the annealing time may be about 0.5-1 hr. The typical gate oxide thickness may be about 5-10 nm. The channel length (i.e. the distance between the source and drain) and the channel width are approximately 200 nm and 10 um, respectively. The device turns on at low voltage which is about at $V_{GS}$<1V. When the $V_{GS}$ is applied over 10V, the $I_{DS}$ reaches a very high current over 1 A. The On/Off ratio is estimated to be over 10 orders of magnitude.

Figure 5:
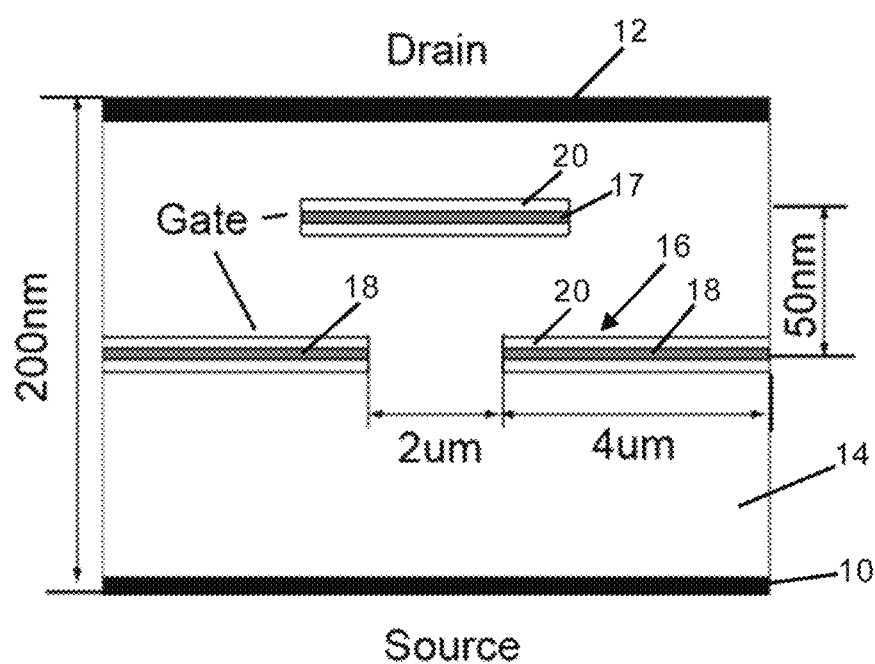
FIG. 5 shows a further example embodiment of a vertical TFT structure in accordance with the present invention.
Figure 6:
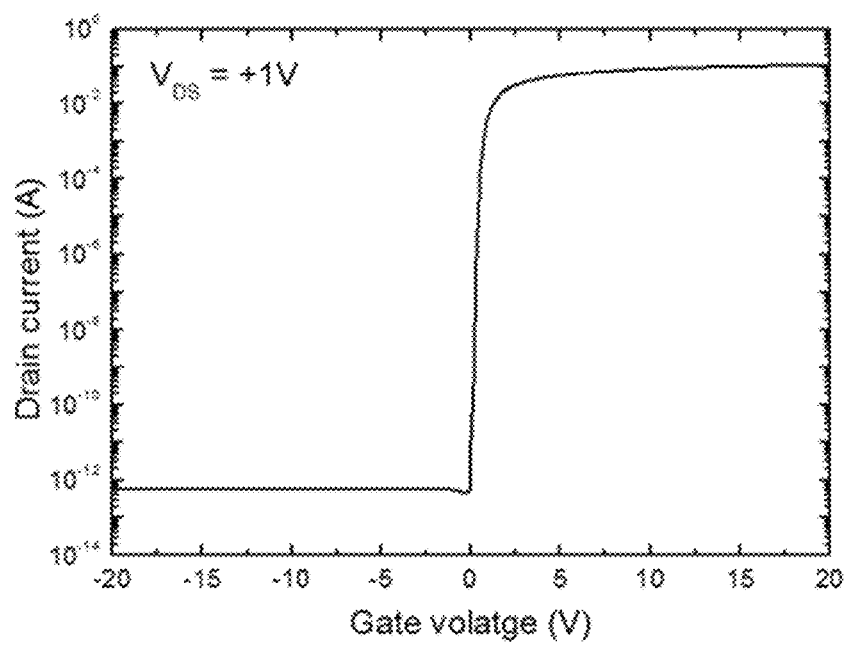
FIG. 6 shows a simulated Ids-Vgs curve at Vds=1V for the vertical TFT structure of FIG. 5.

FIG. 5 is a schematic illustration of a Vertical TFT structure model in accordance with an example embodiment of the present invention. The FIG. 5 TFT shows a dual gate electrode structure where only the bottom gate electrode 16 is a comb-gate electrode with combs 18. FIG. 6 shows a simulated Ids-Vgs curve at Vds=1V for the Vertical TFT structure of FIG. 5, with a-In—Ga—Zn—O (a-IGZO) channels. Similar results can be achieved where both the first and second gate electrodes 16, 17 are comb-gate electrodes, or where there are more than two gate electrodes.

Figures 7A, 7B:
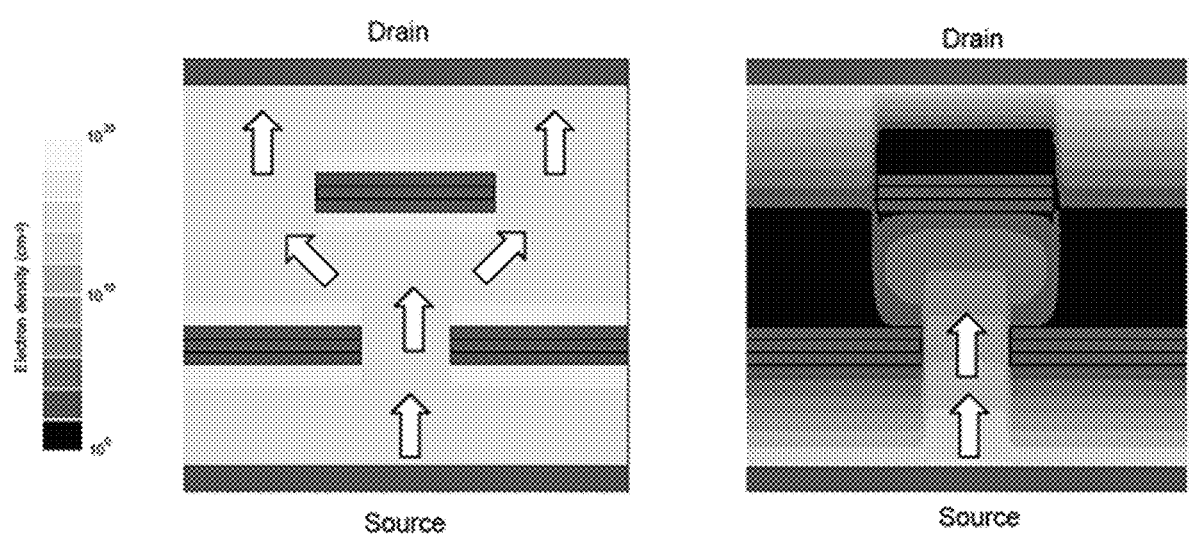
FIG. 7A shows a contour map of electron density and electron flow at a gate voltage in the ON state for the vertical TFT structure of FIG. 5.
FIG. 7B shows a contour map of electron density and electron flow that is blocked in the OFF state for the vertical TFT structure of FIG. 5.

FIG. 7A shows a contour map of electron density ($10-10^{20}$ cm$^{-3}$) and electron flow at a gate voltage in the ON state (+20V) and FIG. 7B shows a contour map of electron density and electron flow that is blocked in the OFF State (−20V) for a Vertical TFT with a-In—Ga—Zn—O (a-IGZO) channels in accordance with the present invention. A high carrier accumulation region with $10^{19}$ cm$^{-3}$ is generated in these comb gate electrodes by a positive gate bias with 20V. In this case, high current flow from drain to source electrode is achieved. In contrast, the depletion region with a carrier density of about <$10^{10}$ cm$^{-3}$ is formed when the gate voltage is −20V. Therefore, current flow is well suppressed at the gap in a comb-gate electrode and is very low level (<fA).

Figure 8A:
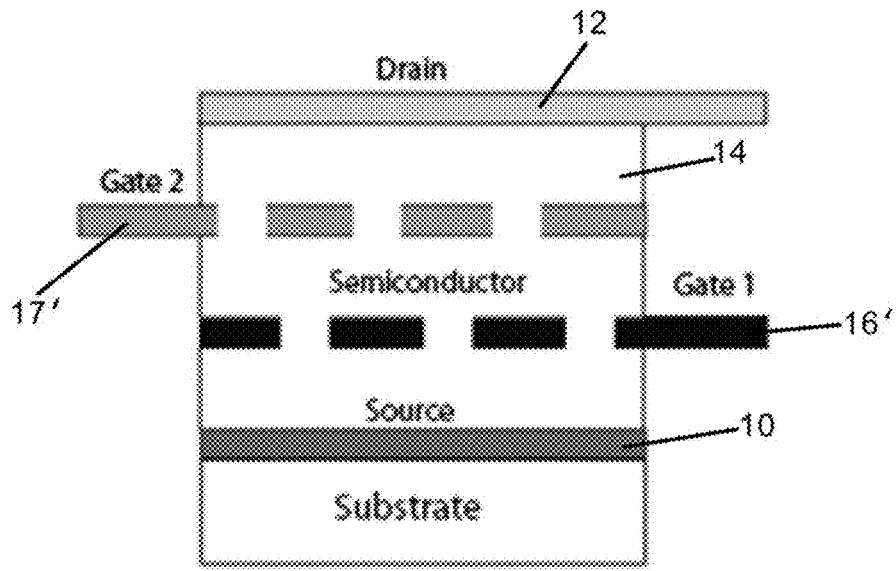
FIGS. 8A and 8B show a further example embodiment of a vertical TFT structure in accordance with the present invention.
Figure 8B:
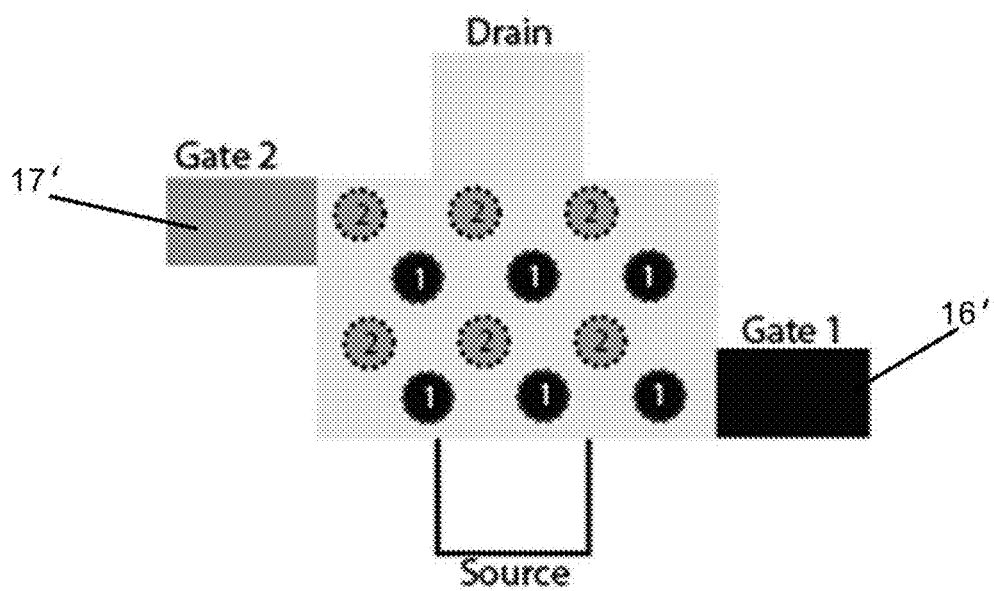

FIGS. 8A and 8B show a further example embodiment of a vertical TFT structure where, instead of the gate electrodes having a comb-like structure, the gate electrodes 16' and 17' have a perforated structure. Such a perforated structure may comprise round holes as shown in FIG. 8B in each gate electrode 16', 17'. Alternatively, similar results may be achieved using square holes or a lattice type structure. Regardless of the configuration of the perforations, the perforations of one gate electrode will be offset from the perforations of the adjacent gate electrode. FIGS. 8A and 8B show the holes 1 of the first gate electrode 16' offset from the holes 2 of the second gate electrode 17'. This arrangement blocks a direct flow of electrons from the source to the drain. The holes may be on the order of 1 um.

Figure 9:
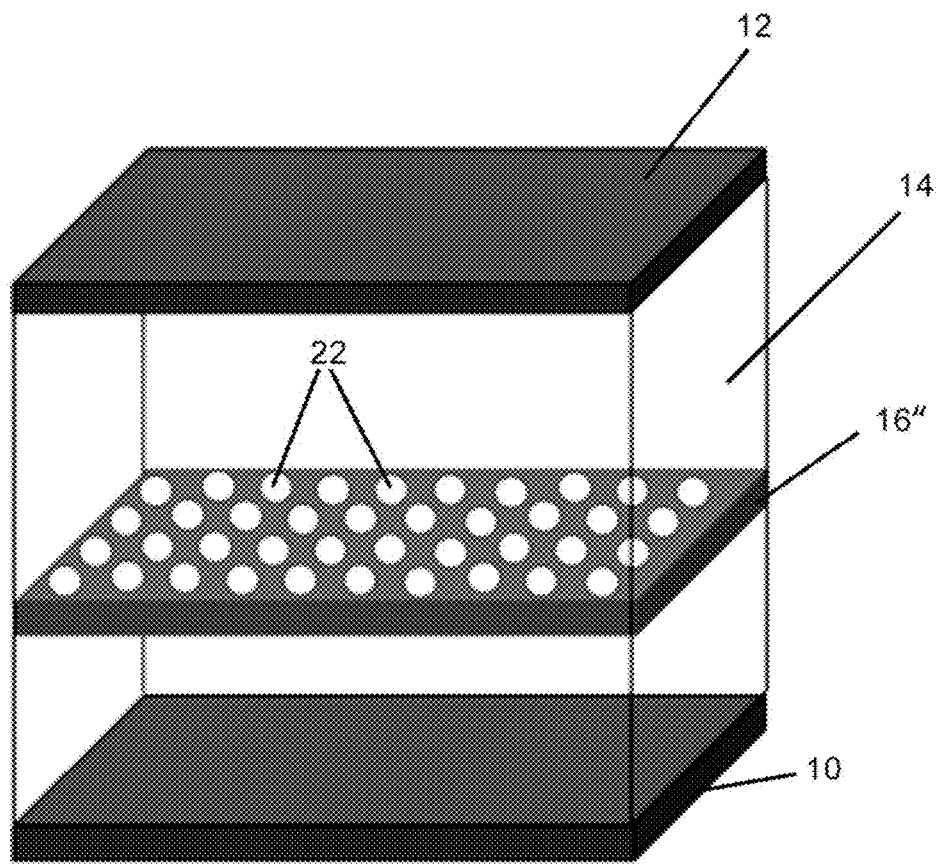
FIG. 9 shows an example embodiment of a vertical TFT with a single gate structure in accordance with the present invention.

FIG. 9 shows a further example embodiment of a vertical TFT in accordance with the present invention having only one gate electrode 16" embedded in the semiconductor layer 14 and arranged between the source electrode 10 and the drain electrode 12. The single gate electrode may comprise micro-perforations 22 configured to control the flow of electrons therethrough in dependence on a predetermined voltage difference between the source electrode and the single gate electrode.

The gate electrode 16" may be formed using one of a CMOS fabrication method, e-beam lithography, and laser lithography. The micro-perforations 22 may be formed due to one of a property of a material of the gate electrode, a property of a material mixed with the material of the gate electrode, a deposition method, a curing method, or an annealing method. For example, a material that is easily oxidized can be mixed with the gate material, such that during the fabrication process the material is removed leaving the holes. Other possibilities for forming such a gate material with perforations exist, such as using a semiconductor material such as silicon or other suitable semiconductor material mixed in with a polymer that is removed in the fabrication process, leaving behind the perforations.

The micro-perforations 22 may have a diameter or width of approximately 1 nm-1 um and a thickness of approximately 10 nm-1 um. In such a gate electrode, the holes may be so small that the electric field between the source and the drain is masked by the single gate electrode. At a predetermined voltage difference between the gate electrode and the source voltage, the masking effect is reduced and the electrons are permitted to pass through the holes. If the gate to source voltage rises further, the rate at which the electrons pass through the perforations may increase. The predetermined voltage may be approximately negative 0.3-10 v in order to terminate electron flow in a depletion-type TFT and approximately positive 0.3-10 v in order to permit electron flow in an accumulation-type TFT.

It should now be appreciated that the present invention provides an advantageous TFT structure employing a gate structure which provides a high drain current with fast switching capabilities.

It should also be noted that the present invention makes it practical to use commonly available fabrication methods in TFT technology that have limited patterning feature size, typically in micrometers. Other fabrication techniques that afford finer feature sizes down to nanometers, or other material innovations for generating perforated gate material may lead to a possibility of reducing the number of gate electrodes to one. The small passageways the electrons have to pass through would control the current flow sufficiently to gain a reasonably good switching behavior with just one layer of gate electrode.

In one example embodiment for fabrication of a Vertical TFT with comb-gate electrodes in accordance with the present invention, one goal is to ensure that the gate electrode(s) are completely insulated (electrically) with an insulator, preferably an oxide or nitride, from the surrounding semiconductor in order for the device to function as a transistor. In such a fabrication method, it is assumed that the semiconductor layer is based on one of silicon or a silicon-based material, a III-V semiconductor material, an organic semiconductor material, a metal oxide type semiconductor material, e.g. IGZO (Indium, Gallium, Zinc, Oxide), that contains oxygen, a metal nitride semiconductor material, e.g. GaN that contains nitrogen, an oxide-based semiconductor material, or a metal oxynitride semiconductor material, e.g. ZnON that contains oxygen and nitrogen. It is also assumed the gate electrode material is a metal, e.g. Aluminum, Silicon, Titanium, or the like. The source and drain electrode material can also be metal, but may or may not be the same metal as the gate electrode, e.g. Molybdenum, Aluminum, or the like. Conductive oxides, e.g. ITO and IZO may also be used for the source/drain electrodes.

In forming the vertical TFT, the deposition order may be (in a vertical stack from bottom to top):
Substrate (insulator)
Source electrode (metal 1)
Semiconducting layer (e.g. IGZO)
Comb Gate electrode 1 (metal 2), patterned (perforated or comb structure)
Semiconducting layer (e.g. IGZO)
Comb Gate electrode 2 (metal 3), patterned (perforated or comb structure)
Semiconducting layer (e.g. IGZO)
Drain electrode (metal 4)

The three different depositions of the same semiconducting material produces one connected semiconducting layer, as the layer boundaries disappear (other than the gate electrodes). Gate electrodes 1 and 2 are initially preferably in Ohmic contact with the semiconducting layer since they are completely encased by the semiconducting layer. The source and drain electrodes are also in ohmic contact with the semiconducting layer and this ohmic contact is to be maintained.

It should be appreciated that, since the semiconducting layers are applied in three stages, different semiconducting materials (or different application techniques) can be used to form each semiconducting layer.

The critical task in the process is to form the insulating layer around the gate electrodes for the device to function, making a Metal(gate)-oxide-semiconductor (MOS) structure.

In the formation of the insulating oxide around the gate electrode structures, the aim is to maintain the ohmic contact of the source and drain electrodes. Using Molybdenum as the source and drain electrode material is preferable, while ITO and IZO can also be used, as these materials also survive with ohmic contact.

A high temperature thermal annealing will produce oxides around the gate electrode metal by drawing oxygen from the semiconducting material that already contains oxygen. However, the aim is to form the insulating oxide around the gate electrodes, but not at the source and drain electrodes.

A first solution is to deposit a different metal for the source and drain contacts (metal 1 and metal 4) that oxidizes at a higher temperature than the gate electrode metal (metal 2 and metal 3). In such an embodiment, the device can be subject to an annealing process at a temperature and duration that forms oxides around the gate electrodes, but not around the source and drain electrodes. For example, aluminum may be used for the gate electrodes and molybdenum may be used for the source and drain electrodes. In general, Aluminum oxidizes at a lower temperature than Molybdenum. Al2O3 (alumina) forms around bare aluminum even at room temperature when exposed to air. At certain annealing temperatures, Aluminum will draw oxygen from the IGZO semiconducting layer to form an Al2O3 insulator, while Molybdenum will stay un-oxidized and maintain the ohmic contact with IGZO.

Even if Molybdenum source or drain electrodes is partially oxidized, the non-stochiometric MoOx that forms is still highly conductive and does not impair device operations. The temperature, the duration of annealing and annealing atmosphere will affect the thickness of the oxide around the gate electrodes.

A second solution is to use local Joules heating. In such an embodiment, the same or different metal may be deposited for the source and drain electrode material (metal 1 and metal 4) and for the gate electrode material (metal 2 and metal 3). The device may be subject to an annealing process at a temperature just below the temperature at which the source and drain electrodes oxidize. Current is then applied between the two gate electrodes to produce Joules heating on the surface of the gate electrodes. The current can be AC or DC, or a combination (e.g. AC with a DC offset). The gate electrodes will oxidize due to locally elevated temperatures. The current will be reduced or stop flowing once the oxidation is complete and gate electrodes are insulated.

The current can also be applied between the gate electrode(s) and either the source or drain electrodes, or both. The larger surface area on the source and drain electrodes would reduce Joules heating there. As a result, the gate electrode(s) heat up more than the source and drain electrodes, and thus will oxidize before the source and drain electrodes.

It might be advantageous if only one of the two gate electrodes is selected at a time for joules heating since the larger combined surface area of the source and the drain electrodes will reduces corresponding joules heating at the source and the drain electrodes, localizing heating to that one gate electrode so that it oxidizes before the source and drain electrodes.

The progress and completion of the oxide formation can be monitored by resistance or capacitance measurements, or by an amount of time measurement of the current flow.

A third solution is use voltage to assist in oxide formation in addition to the techniques of solution two above, in order to obtain a thicker oxidation layer around the gate electrodes. Like solution two above, the same or different metals may be used for the source and drain electrodes as well as for the gate electrodes. The device may be subject to an annealing process at a temperature just below the temperature at which the source and drain electrodes oxidize. Current is then applied between the two gate electrodes to produce Joules heating on the surface of the gate electrodes. When the current stops flowing, it indicates a formation of at least a thin layer of oxide around the gate electrodes. At this stage, a higher voltage may be applied to the gate electrodes. The resultant high electric field will promote more migration of the oxygen out of the metal oxide semiconductor (e.g. IGZO) and allow thicker formation of the oxide around the gate electrodes. The applied voltage can be AC or DC, or a combination (e.g. AC with a DC offset). The voltage may be increased as the oxide gets thicker, but below the breakdown voltage of the oxide already formed. A capacitance measurement will be an indication of the thickness of the oxide formed and can be used to stop the applied voltage and the annealing process. The optimum duration, the temperature profile over time, and the voltage profile over time can be determined experimentally. Certain parameters can be modified or modulated based on the on-going measurements, including the capacitance.

It should be appreciated that in the second and third solutions discussed above, the polarity of the DC current or voltage will impact the process. A positive voltage on the gate electrode will help attract the oxygen atoms (which are typically negatively charged) to the gate electrode to oxidize the gate electrode. Conversely a negative voltage on the source or drain electrode will prevent or slow down oxidation and therefore help maintain the ohmic contact of the source or drain electrode with the semiconductor layer.

Although the invention has been described in connection with various illustrated embodiments, numerous modifications and adaptations may be made thereto without departing from the spirit and scope of the invention as set forth in the claims.

What is claimed is:

1. A vertical TFT, comprising:
   a source electrode and a drain electrode extending parallel to each other;
   a semiconductor layer arranged in between the source electrode and the drain electrode; and
   a single gate electrode embedded in the semiconductor layer, the single gate electrode comprising micro-perforations configured to control the flow of electrons therethrough in dependence on a predetermined voltage difference between the source electrode and the single gate electrode;
   wherein the gate electrode is fully insulated from the semiconductor layer by an insulator.

2. A vertical TFT in accordance with claim 1, wherein the gate electrode is formed using one of a CMOS fabrication method, e-beam lithography, and laser lithography.

3. A vertical TFT in accordance with claim 1, wherein the micro-perforations are formed due to one of a property of a material of the gate electrode, a property of a material mixed with the material of the gate electrode, a deposition method, a curing method, or an annealing method.

4. A vertical TFT in accordance with claim 1, wherein the micro-perforations have a diameter or a width of approximately 1 nm-1 um and a thickness of approximately 10 nm-1 um.

5. A vertical TFT in accordance with claim 1, wherein:
   the gate electrode masks a direct electric field between the source electrode and the drain electrode; and
   a rate of flow of electrons through the perforations is increased with an increase in the predetermined voltage.

6. A vertical TFT in accordance with claim 1, wherein the insulator comprises an oxide or a nitride.

7. A vertical TFT in accordance with claim 1, wherein the semiconductor layer comprises one of silicon, a III-V semiconductor material, an organic semiconductor, a metal-oxide based semiconductor, a silicon-based material, and an oxide-based material.

8. A vertical TFT in accordance with claim 1, wherein the semiconductor layer and the gate electrode are formed by one of a physical vapor deposition process and a solution process.

9. A vertical TFT in accordance with claim 1, wherein the insulator is formed on the gate electrode by a post-thermal annealing process.

* * * * *